US009831236B2

(12) United States Patent
Lee et al.

(10) Patent No.: US 9,831,236 B2
(45) Date of Patent: Nov. 28, 2017

(54) ELECTROSTATIC DISCHARGE (ESD) PROTECTION TRANSISTOR DEVICES AND INTEGRATED CIRCUITS WITH ELECTROSTATIC DISCHARGE PROTECTION TRANSISTOR DEVICES

(71) Applicant: GLOBALFOUNDRIES, Inc., Grand Cayman (KY)

(72) Inventors: Chien-Hsin Lee, Malta, NY (US); Xiangxiang Lu, Singapore (SG); Mahadeva Iyer Natarajan, Clifton Park, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

(21) Appl. No.: 14/699,134

(22) Filed: Apr. 29, 2015

(65) Prior Publication Data

US 2016/0322345 A1   Nov. 3, 2016

(51) Int. Cl.
*H01L 23/62* (2006.01)
*H01L 27/02* (2006.01)
*H01L 27/088* (2006.01)
*H01L 29/06* (2006.01)

(52) U.S. Cl.
CPC ...... *H01L 27/0266* (2013.01); *H01L 27/0292* (2013.01); *H01L 27/088* (2013.01); *H01L 29/0619* (2013.01)

(58) Field of Classification Search
CPC ............ H01L 27/0266; H01L 29/0619; H01L 27/0292; H01L 27/088; H01L 27/20255; H01L 27/0251; H01L 27/0262; H01L 27/0259
See application file for complete search history.

(56) References Cited

U.S. PATENT DOCUMENTS

| | | | |
|---|---|---|---|
| 5,164,811 A * | 11/1992 | Tamura | H01L 27/11807 257/206 |
| 6,236,073 B1 | 5/2001 | Hsu | |
| 6,274,909 B1 | 8/2001 | Chang et al. | |
| 6,476,449 B1 | 11/2002 | Lin | |
| 6,563,175 B2 | 5/2003 | Shiau et al. | |
| 6,566,717 B2 | 5/2003 | Jung | |
| 6,583,972 B2 | 6/2003 | Verhaege et al. | |
| 6,898,062 B2 | 5/2005 | Russ et al. | |
| 6,927,458 B2 | 8/2005 | Worley | |
| 7,005,708 B2 | 2/2006 | Mergens et al. | |

(Continued)

*Primary Examiner* — Su C Kim
(74) *Attorney, Agent, or Firm* — Lorenz & Kopf, LLP

(57) ABSTRACT

An electro-static discharge (ESD) protection transistor device includes a plurality of transistor gates that extend parallel to one another in a first direction and a plurality of source/drain diffusion areas that extend parallel to one another in a second direction perpendicular to the first direction. Each source/drain diffusion area comprises a plurality of source/drain areas disposed between respective ones of the plurality of transistor gates. The ESD protection transistor device further includes a source contact positioned over each source area of the plurality of source areas and a drain contact positioned over each drain area of the plurality of drain areas. With respect to each source/drain diffusion area of the plurality of source/drain diffusion areas, the source contacts are offset from the drain contacts with respect to the first direction.

20 Claims, 2 Drawing Sheets

(56) References Cited

U.S. PATENT DOCUMENTS

| | | |
|---|---|---|
| 7,317,228 B2 | 1/2008 | Chen |
| 7,557,413 B2 | 7/2009 | Chen |
| 8,648,421 B2 | 2/2014 | Wen et al. |
| 2005/0001271 A1* | 1/2005 | Kobayashi ........ H01L 27/11807 257/368 |
| 2005/0029597 A1* | 2/2005 | Worley ............... H01L 29/0692 257/355 |
| 2006/0175665 A1* | 8/2006 | Chen ................... H01L 27/0277 257/384 |
| 2013/0181211 A1* | 7/2013 | Chen ................... H01L 27/0262 257/43 |
| 2014/0159207 A1 | 6/2014 | Domanski |

* cited by examiner

ELECTROSTATIC DISCHARGE (ESD) PROTECTION TRANSISTOR DEVICES AND INTEGRATED CIRCUITS WITH ELECTROSTATIC DISCHARGE PROTECTION TRANSISTOR DEVICES

TECHNICAL FIELD

The technical field relates generally to electrostatic discharge protection transistor devices and integrated circuits with such devices. More particularly, the technical field relates to multi-finger electrostatic discharge protection transistor devices and integrated circuits with such devices.

BACKGROUND

Various types of circuits and devices are vulnerable to damage from electrostatic discharge (ESD). ESD occurs when a user of the circuit or device becomes electrostatically charged, for example by friction or induction, and then discharges through a pin or contact pad of the circuit or device. Integrated circuits (ICs), particularly ICs containing MOS (metal-oxide semiconductor) transistors, are vulnerable to such ESD damage. ESD may be inadvertently applied to input/output (I/O) or power pins or other pads of the IC, which can damage sensitive semiconductor junctions, dielectrics, interconnections, or other sub-elements of the IC.

Various protection techniques have been developed to protect circuitry from ESD. The main goal of ESD protection is to shunt ESD current away from vulnerable circuitry and through a special circuit path designed to dissipate such events. Thus, the high voltage and current caused by an ESD event is diverted away from the main circuitry of the IC. Such ESD circuits or structures (sometimes referred to as ESD protection circuits or clamps) may, for example, be placed in parallel across two input pins or pads, such as an I/O pad and ground, and therefore also in parallel across sensitive circuitry coupled to the two pads. Desirably, such ESD protection is unobtrusive or "invisible" to the normal operation of the circuit, so that its presence does not slow or otherwise negatively impact the operation of the remaining IC circuitry when no ESD event is occurring.

A common technique to prevent ICs from being damaged by ESD events uses a "multi-finger" ESD protection transistor device on the input/output pads of ICs. A multi-finger ESD protection transistor device is a series of transistors placed in parallel like "fingers" across the input/output pads of an IC so that it can have relatively large device widths to discharge ESD currents to ground potential. To function properly, the activation or "trigger" voltage of the multi-finger ESD protection transistor device should be larger than the operating voltage of the other devices not used for ESD protection. As such, the multi-finger ESD protection transistor device should not activate during normal operation of the circuit.

A well-known problem with multi-finger ESD protection transistor devices is the possibility of non-uniform triggering of the finger transistors. That is, in some instances, only the first finger transistor of the multi-finger device may activate, causing the current passing therethrough to exceed the design limitations. To ensure uniform activation of all of the finger transistors of the multi-finger ESD protection transistor device, one known approach is to add ballasting resistors in the substrate adjacent to each finger transistor to increase the resistance of the substrate and thereby the trigger voltage of the subsequently triggered finger transistor (on the basis of Ohm's law, voltage increases in proportion to resistance). For instance, the substrate resistance can be increased by increasing the distance of the substrate contact from the source/drain region of the transistor, or by increasing the P-well or N-well sheet resistance.

In some prior art examples, for sufficient ESD robustness of the ESD devices in CMOS integrated circuits, a salicide (self-aligned silicide) blocking (SAB) layer can be disposed on the substrate to block salicide formation over any ballasting resistors, which protects these resistors from silicidation during source/drain contact formation, thereby allowing these resistors to maintain an appropriate ballast resistance to increase the current uniformity, as noted above. In advanced processes for forming high-k gate dielectric and metal gates, however, a SAB layer may not be desirable due to the increase in surface area required for such a structure. That is, advanced processes commonly employ smaller device pitches, which do not permit the surface area or spacing required between each finger transistor when a SAB layer is employed. Hence, a design that sustains high ESD robustness in fully-salicided ESD devices (i.e., those devices not employing an SAB layer) is desirable.

Accordingly, it is desirable to provide integrated circuits with an improved ESD protection functionality to maximize uniform triggering of the finger transistors. It is further desirable to provide fully-silicided, multi-finger ESD protection transistor devices that minimize the footprint or area required for their operation. Still further, other desirable features and characteristics of the present invention will become apparent from the subsequent detailed description and the appended claims, taken in conjunction with the accompanying drawings and this background.

BRIEF SUMMARY

Electrostatic discharge protection transistor devices and integrated circuits with electrostatic discharge protection transistor devices are disclosed herein. In one exemplary embodiment, an electro-static discharge (ESD) protection transistor device includes a plurality of transistor gates that extend parallel to one another in a first direction and a plurality of source/drain diffusion areas that extend parallel to one another in a second direction perpendicular to the first direction. Each source/drain diffusion area comprises a plurality of source/drain areas disposed between respective ones of the plurality of transistor gates. The ESD protection transistor device further includes a source contact positioned over each source area of the plurality of source areas and a drain contact positioned over each drain area of the plurality of drain areas. With respect to each source/drain diffusion area of the plurality of source/drain diffusion areas, the source contacts are offset from the drain contacts with respect to the first direction.

In another exemplary embodiment, an integrated circuit structure includes a semiconductor substrate, a plurality of active integrated circuit structures formed on the semiconductor substrate, a chip pad or pin providing electrical connection to the plurality of active integrated circuit structures, and, on the semiconductor substrate and in the proximity of the chip pad or pin, an ESD protection device. The ESD protection device includes a plurality of transistor gates that extend parallel to one another in a first direction and a plurality of source/drain diffusion areas that extend parallel to one another in a second direction perpendicular to the first direction. Each source/drain diffusion area comprises a plurality of source/drain areas disposed between respective ones of the plurality of transistor gates. The ESD protection transistor device further includes a source contact positioned over each source area of the plurality of source areas and a drain contact positioned over each drain area of the plurality of drain areas. With respect to each source/drain diffusion area of the plurality of source/drain diffusion areas, the source contacts are offset from the drain contacts with respect to the first direction.

In yet another exemplary embodiment, an ESD protection device includes a guard ring doped with an n-type dopant defining therewithin an ESD active area of a semiconductor substrate that is doped with a p-type ion dopant. The guard ring has a plurality of guard ring contact positioned thereover. The ESD protection device further includes a plurality of source/drain diffusion areas disposed within the ESD active area that are doped with an n-type dopant, that extend parallel to one another in a first direction, and that are spaced apart from one another in a second direction that is perpendicular to the first direction. Each source/drain diffusion area of the plurality of source/drain diffusion areas are elongated in configuration and extend discontinuously lengthwise in the first direction a greater distance than widthwise in the second direction. Further, each source/drain diffusion area is spaced apart in the second direction by a spacing distance that is less than each source/drain diffusion area extends widthwise in the second direction The ESD protection device further includes a plurality of transistor gates that extend parallel to one another in the second direction, each of which extends over each source/drain diffusion area of the plurality of source/drain diffusion areas so as to divide each source/drain diffusion area into a plurality of source areas and a plurality of drain areas. The plurality of transistor gates are configured in groupings of two parallel, adjacent transistor gates so as to divide each source/drain diffusion area of the plurality of source drain diffusion area into groupings of two source areas spaced apart by one drain area or two drain areas spaced apart by one source area. Also, with respect to each source/drain diffusion area, the source contacts are co-linear with respect to one another in the second direction and the drain contacts are co-linear with respect to one another in the second direction. Still further, the ESD protection device includes a source contact positioned over each source area of the plurality of source areas and a drain contact positioned over each drain area of the plurality of drain areas, wherein, with respect to each source/drain diffusion area of the plurality of source/drain diffusion areas, the source contacts are offset from the drain contacts with respect to the second direction.

BRIEF DESCRIPTION OF THE DRAWINGS

The various embodiments will hereinafter be described in conjunction with the following drawing figures, wherein like numerals denote like elements, and wherein.

DETAILED DESCRIPTION

The following Detailed Description is merely exemplary in nature and is not intended to limit the various embodiments or the application and uses thereof. Furthermore, there is no intention to be bound by any theory presented in the preceding background or the following detailed description.

Embodiments of the present disclosure are generally directed multi-finger electrostatic discharge protection transistor devices and to integrated circuits with such devices. For the sake of brevity, conventional techniques related to integrated circuit device fabrication may not be described in detail herein. Moreover, the various tasks and process steps described herein may be incorporated into a more comprehensive procedure or process having additional steps or functionality not described in detail herein. In particular, various steps in the manufacture of semiconductor-based structures are well-known and so, in the interest of brevity, many conventional steps will only be mentioned briefly herein or will be omitted entirely without providing the well-known process details.

Figure 1:
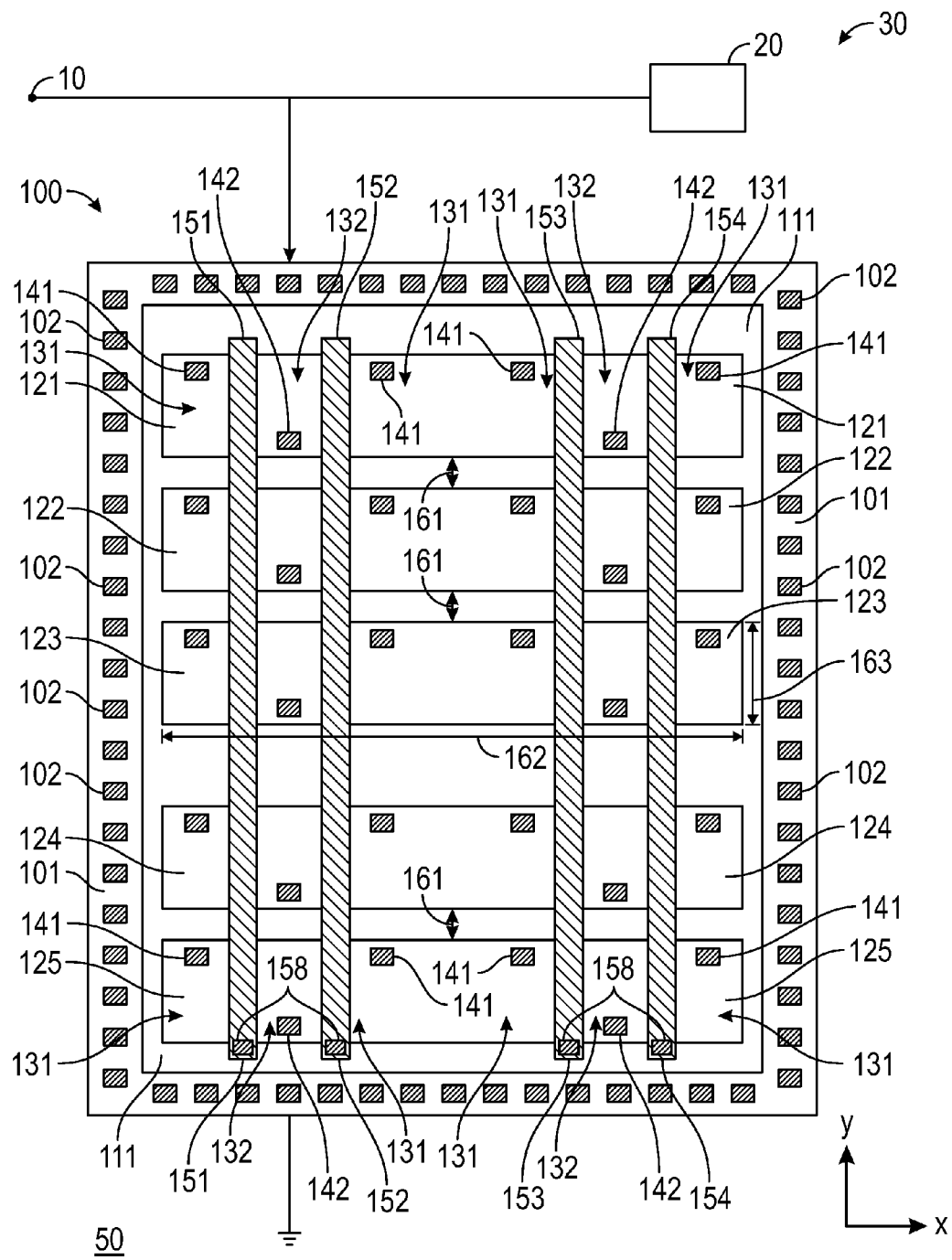
FIG. 1 illustrates an electrostatic discharge protection transistor device in accordance with some embodiments of the present disclosure.

FIG. 1 illustrates an integrated circuit 30 with an electrostatic discharge (ESD) protection transistor device 100, implemented on a semiconductor substrate 50, which includes ESD protection transistors in accordance with some embodiments of the present disclosure. One or more of chip pads or pins 10 of the integrated circuit may be associated with an ESD protection transistor device, and as such the illustrated device 100 is exemplary of a plurality of such devices that may be included as part of the integrated circuit. The ESD protection transistor device 100 is physically placed in proximity to a chip pad or pin 10 of the integrated circuit to minimize the impedance to an electrostatic discharge or voltage overshoot/undershoot. The ESD protection transistor device 100 is placed electrically in parallel with internal (active device) circuitry 20 of the integrated circuit, absorbs excess current resulting from an electrostatic discharge or a voltage overshoot/undershoot, and thus protects the internal circuitry 20 of the integrated circuit from damage by grounding any current flowing through the ESD current ($V_{SS}$).

As noted, the ESD protection transistor device 100 is implemented as part of the integrated circuit 30 formed on the semiconductor substrate 50. As used herein, the term "semiconductor substrate" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. Apart from the ESD protection transistor device as described herein, the integrated circuit may include various microelectronic elements (not shown) for which the ESD protection transistor device provides protection, also referred to herein as active integrated circuits. Examples of the various microelectronic elements that may be formed in the substrate 50 include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; or other suitable elements. Various processes are performed to form the various microelectronic elements including deposition, etching, implantation, photolithography, annealing, or other suitable processes. The microelectronic elements are interconnected to form the integrated circuit 30, which may be a logic device, a memory device (e.g., static random access memory or SRAM), a radio frequency (RF) device, an input/output (I/O) device, a system-on-chip (SoC) device, combinations thereof, or another suitable type of device. As noted above, the ESD protection transistor device 100 may be configured electrically in parallel with the internal circuitry 20. Moreover, the ESD protection transistor device 100 is configured with a trigger voltage threshold that is greater than a voltage threshold of the internal circuitry 20.

The ESD protection transistor device 100 is generally defined by an area on the integrated circuit 30 that is inclusive of and surrounded by a guard ring 101. The guard ring 101 is provided having sufficient size and dimension to fully enclose an "active area" 111 of the ESD protection transistor device 100 within the guard ring 101, as will be discussed in greater detail below. The guard ring 101 is provided to prevent electrical current from leaking out of the ESD protection transistor device 100 and causing the latchup to damage the surrounding circuitry. In exemplary embodiments, the guard ring 101 is provided in a generally square or rectangular configuration as illustrated in FIG. 1. In other embodiments, however, the guard ring 101 may be circular, triangular, or any other geometric configuration suitable within the constraints of the design of the integrated circuit upon which the ESD protection transistor device 100 is implemented. The guard ring 101 may be formed by the implantation of dopant ions into the semiconductor substrate 50. While either n-type or p-type dopant ions may be used, in the illustrated embodiment, n-type dopant ions are implanted to form the guard ring 101. Examples of n-type dopants suitable for forming guard ring 101 include antimony, phosphorous, and arsenic ions, while examples of p-type dopants include boron, aluminum, and gallium ions. The implantation of dopant ions may be performed in accordance with methods known in the art, for example the masking of the semiconductor substrate 50, following by ion implantation of the dopant species into the unmasked areas of the semiconductor substrate 50.

The guard ring 101 includes a plurality of guard ring contacts 102 that are deposited onto the guard ring 101, and which are therefore in electrical and physical contact guard ring 101. The guard ring contacts 102 provide an electrical connection with the guard ring 101, and in this regard may be formed of a suitable electrically-conductive material, such as tungsten, aluminum, or the like. As shown in FIG. 1, the guard ring contacts 102 may be formed using a regular spacing about the guard ring 101. In other embodiments, however, there may be more or fewer guard ring contacts 102 provided, and they may have a smaller or greater spacing, or an irregular spacing. The guard ring contacts 102 may be formed in a conventional manner, for example with the silicidation of the substrate 50, the deposition of an inter-layer dielectric (ILD) over the substrate 50, patterning and etching the ILD to form a plurality of contact holes therein, and depositing the electrically-conductive material in the holes. Given that the ESD protection transistor device 100 may be fully silicided, it is noted that the silicidation and patterning of contact holes may occur at the same time as the silicidation and patterning of contact holes over other portions of the ESD protection transistor device 100, as will be described in greater detail below.

Within the bounds of the guard ring 101 is defined an ESD active area 111. The ESD active area 111 is the region of the ESD protection transistor device 100 within which the multi-finger transistors are disposed, as will be described in greater detail below. The ESD active area 111 is optionally doped with an ionic species of a type opposite that of the guard ring 101. For example, where the guard ring 101 is doped with an n-type dopant ion, the ESD active area 111 may be doped with a p-type dopant ion, or vice versa. Such doping may be accomplished using known methods, such as ion implantation.

Disposed within the ESD active area 111 are a plurality of transistor gate structures 151, 152, 153, and 154. Each such gate structure includes a layer of a gate dielectric material, such as a silicon oxide or a metal oxide, and a layer of a conductive gate electrode material formed over the gate dielectric material layer, such as a polycrystalline silicon material or a metal. Although four transistor gate structures 151-154 are illustrated in FIG. 1, more or fewer may be provided in an embodiment. Moreover, although the four transistor gate structures 151-154 are shown in parallel groupings of two (i.e., gate structure 151 is parallel and adjacent to gate structure 152, both of which are spaced apart from gate structures 153 and 154, which are parallel and adjacent to one another), in other embodiments, it is possible to have groupings of three, four, or more transistor gate structures. The number of groups provided, and the number of gate structures in each group, is dependent on the length 162 of each source/drain diffusion area 121-125, to be discussed below. The transistor gate structures 151-154 are formed in the conventional manner, such as with the deposition of a gate insulator material and a conductive gate material (such as polycrystalline silicon) over the ESD active area 111, and patterning and etching the gate material into the transistor gates 151-154. The transistor gate structures 151-154 may each include one or more gate contacts 158. The gate contacts 158 may be formed in a conventional manner, for example with the silicidation of the gate structures 151-154, the deposition of an inter-layer dielectric (ILD), patterning and etching the ILD to form a plurality of contact holes therein, and depositing the electrically-conductive material in the holes. Given that the ESD protection transistor device 100 may be fully silicided, it is noted that the silicidation and patterning of contact holes for gate contacts 158 may occur at the same time as the silicidation and patterning of contact holes over other portions of the ESD protection transistor device, as will be described in greater detail below.

As further shown in FIG. 1, disposed within the ESD active area 111 are a plurality of source/drain diffusion areas 121, 122, 123, 124, and 125, which are self-aligned with the transistor gate structures 151-154. The term source/drain diffusion area is used herein to refer to an elongated impurity-doped region of the ESD active area 111 that extends perpendicular to the transistor gate structures 151-154 but is discontinuous insofar as the doping does not extend underneath each of the transistor gate structures 151-154. Each source/drain diffusion area 121-125 comprises a plurality of source/drain areas 131/132, as will be described in greater detail below, which are formed between the transistor gate structure 151-154 in a respective source/drain diffusion area. In this manner, the transistor gate structures "divide" the source/drain diffusion areas 121-125 into their respective plurality of source/drain areas 131/132, as illustrated. While five such source/drain diffusion areas 121-125 are illustrated in FIG. 1, it should be appreciated that more or fewer source/drain diffusion areas may be provided in a given embodiment. The source/drain diffusion areas 121-125 may be formed in accordance with conventional self-aligned doping methods known in the art, wherein spacer structures are formed about the transistor gate structures 151-154, dopant ions are implanted, and then the spacer structures may be fully or partially removed. The number of such areas 121-125 provided depends on the ESD protection requirements of the ESD protection transistor device 100. That is, more source/drain diffusion areas will be able to provide protection against a larger discharge, and vice versa. The source/drain diffusion areas 121-125 are formed by the implantation of conductivity-determining impurity species of a type opposite that of the ESD active area 111. The conductivity-determining impurity species implanted to form the diffusion areas 121-125 is also the same as that of the ESD guard ring 101. For example, in the illustrated embodiment where the ESD guard ring 101 is doped with an p-type impurity ion and the ESD active area 111 is doped with a p-type impurity ion, the source/drain diffusion areas 121-125 are all doped with an n-type impurity ion. It also can be that the ESD guard ring 101 is doped with an n-type impurity ion and the ESD active area 111 is doped with a n-type impurity ion, and the source/drain diffusion areas 121-125 are all doped with an p-type impurity ion. Each source/drain diffusion area 121-125 may extend lengthwise in a first direction a greater distance than widthwise in a second direction. That is, in such embodiments, the source/drain diffusion areas 121-125 may each have a generally rectangular shape, which is defined by a length 162 as measured in the first direction and a width 163 as measured in the second direction. For purposes of clarity in discussion, the length 162 is defined in the first direction along the x-axis direction of FIG. 1, and the width 163 is defined in the second direction, perpendicular to the first direction, along the y-axis direction of FIG. 1. In some embodiments, the length 162 may be several times in magnitude that of the width direction, such as two, three, four, five, eight, ten, or more times in magnitude. For example, in the illustrated embodiment, the length 162 is about six times longer than the width 163. Within the ESD active area 111, the source/drain diffusion areas 121-125 are positioned parallel to one another with their lengths 162 extending in the x-axis direction. The source/drain diffusion areas 121-125 are spaced apart from one another in the y-axis direction by a diffusion area spacing distance 161. Diffusion area spacing distance 161, in an embodiment, is several times smaller than the y-axis width 162, such as two, three, four, five, eight, ten, or more times in magnitude smaller. For example, in the illustrated embodiment, the diffusion area spacing distance 161 is about one-third of the width 163.

Each of the transistor gate structures 151-154 extends lengthwise in the y-axis direction so as to intersect and divide each of the source/drain diffusion areas 121-125 into their respective source/drain areas 131/132. That is, this intersection divides each of the source/drain diffusion areas 121-125 into source areas 131 and drain areas 132. The source areas 131 are on opposite sides of a respective transistor gate structure from the drain areas 132. Given the illustrated grouping of two transistor gates 151/152 and 153/154, each group 151/152 and 153/154 divides the source/drain diffusion areas into three areas 131/132. As shown, two of these areas are source areas 131, and one of the areas is a drain area 132, although in other embodiments, two drain areas 132 and one source area 131 could be provided. That is, each source/drain diffusion area 121-125 is divided into groupings of two source areas 131 spaced apart by one drain area 132, or two drain areas 132 spaced apart by one source area 131. It should be noted that, consistent with the terminology used in the art, each of the transistor gates 151-154 may form a "finger" of the ESD protection transistor device 100 to thereby provide the ESD protection transistor device 100 as a multi-finger ESD protection transistor device.

In the embodiment of FIG. 1, each source area 131 has a source contact 141 positioned thereover, and each drain area has a drain contact 142 positioned thereover, both of which are in electrical and physical contact with their respective areas. The source contacts 141 and drain contact 142 provide an electrical connection to their respective source area 131 and drain area 132. These contacts 141/142 may be formed in the conventional manner as discussed above with regard to the guard ring contacts 102 (i.e., silicidation, ILD formation, patterning/etching, and deposition of electrically-conductive material), and optional in the same process step. As shown in FIG. 1, the source contacts 141 are staggered apart or offset from the drain contacts 142 in the y-axis direction. That is, with respect to each source/drain diffusion area 121-125, each source contact 141 may be co-linear with respect to each other source contact 141 in the y-axis direction, but is offset with respect to each drain contact 142 in the y-axis direction. Moreover, each drain contact 142 may be co-linear with respect to each other drain contact 142 in the y-axis direction. Without being bound by any particular theory, it is believed that this offsetting of the source and drain contacts 141, 142 provides a longer distance for the ESD current to travel through the source/drain diffusion areas 121-125 and under the transistor gates 151-154, thus creating a larger resistance and a greater effectiveness of the ESD protection transistor device 100.

Accordingly, the presently described embodiment provides an improvement over the prior art in that resistance is increased through the device without the need to include separate ballasting resistors. Without the need for ballasting resistors to be formed on the ESD protection transistor device 100, which cannot be silicided and which require masking protection against silicidation, the ESD protection transistor device 100 may be fully-silicided at the transistor gate structures 151-154 and at the source/drain areas 121-125. That is, a silicide-forming metal can be deposited over the entirety of these structures and areas in a single deposition step, followed by annealing and the removal of excess silicide-forming metal. Fully siliciding the ESD protection transistor device 100 allows for maximized contact density within the ESD active area 111. Thus, the presently disclosed ESD protection transistor device 100 provides the benefits of greater ESD protection in a smaller device area.

Figure 2:
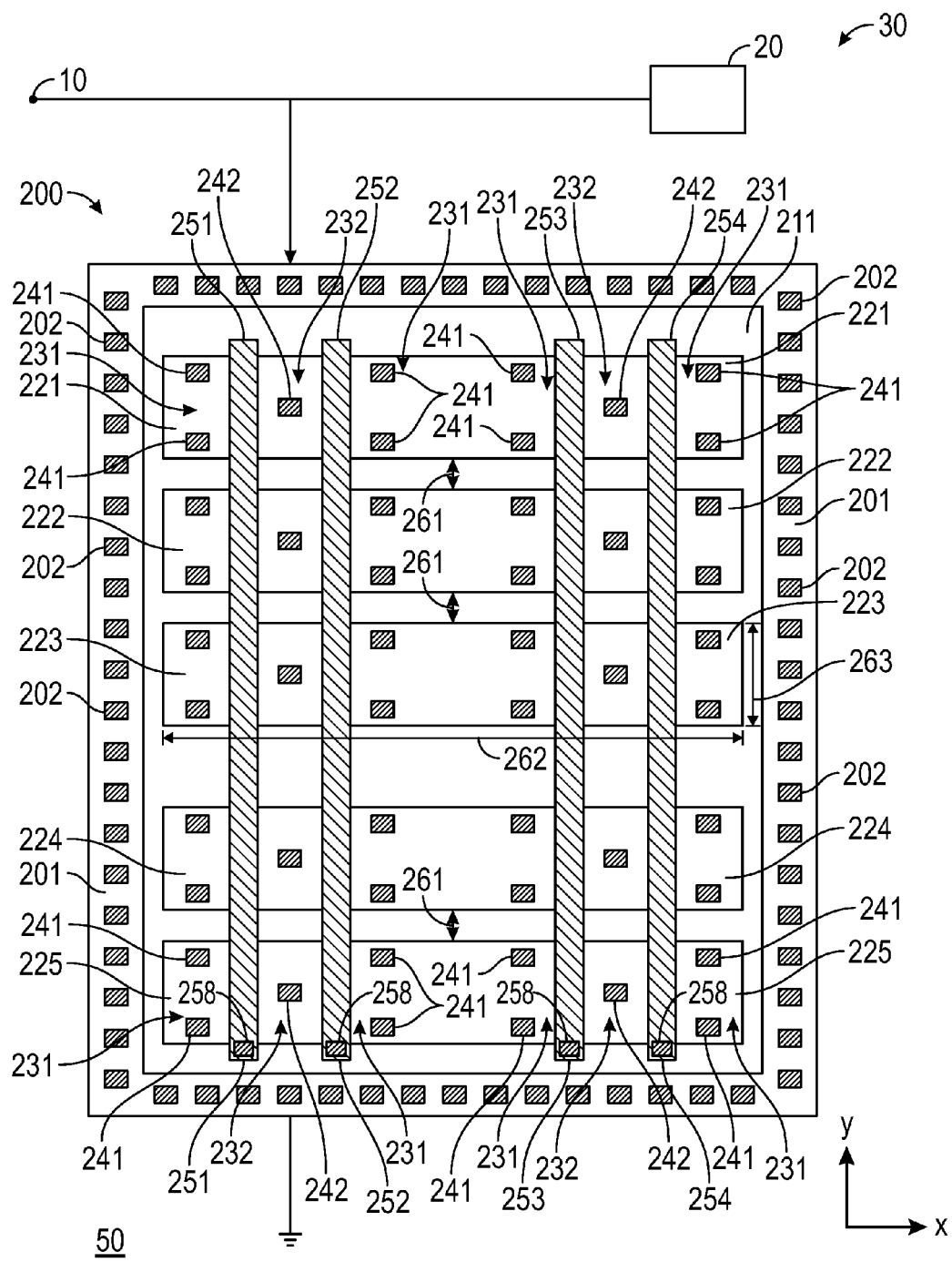
FIG. 2 illustrates an electrostatic discharge protection transistor device in accordance with further embodiments of the present disclosure.

Another embodiment of the present disclosure is provided in FIG. 2. That is, FIG. 2 discloses an alternatively-configured ESD protection transistor device 100. Each of the elements described above in connection with the ESD protection transistor device 100 is provided as well in the ESD protection transistor device 200, with the difference being in the number and configuration of the source and drain contacts. For ease of reference and discussion, the reference numerals shown in FIG. 2 have been incremented by 100 with respect to their counterparts in FIG. 1. In this manner, the ESD protection transistor device 200 includes a guard ring 201, a plurality of guard ring contacts 202, and ESD active area 211, a plurality of source/drain active areas 221-225 (each having length 262 and width 263, and being separated from one another in the y-axis direction by spacing distance 261), which are divided each into a plurality of source areas 231 and drain areas 232, a plurality of source contacts 241, drain contacts 242, and gate contacts 258, and a plurality of transistor gates 251-254. With the exception of the source contacts 241 and the drain contacts 242, each of the other elements shown in FIG. 2 is configured substantially as their counterparts in FIG. 1, and as such will not be described herein in greater detail for purposes of brevity and simplicity of discussion.

Turning now to the configuration of the source contacts 241 and the drain contacts 242 of the ESD protection transistor device 200, in this embodiment, each source area 231 includes two source contacts 241, which are spaced apart from one another in the y-axis direction. For each source area 231 of a particular source/drain diffusion area, the two source contacts 241 are spaced apart from one another by the same amount. Thus, with respect to each source/drain diffusion area 221-225, there are two parallel "rows" of source contacts 241 extending in the x-axis direction, and spaced apart from one another in the y-axis direction. The drain contacts 242, with respect to each drain area 232, are offset from each of the source contacts 241 in the y-axis direction. More particularly, with respect to the above noted two parallel rows of source contacts 241, the drain contact of each drain area 232 is positioned so as to be in between (with respect to the y-axis direction) such two parallel rows of source contacts 241, thereby forming a single row. In the alternative, the contacts 241/242 and configuration of the source and drain areas 231/232 may be reversed, such that each source area 231 has one contact 241, and each drain area 232 has two contacts 242.

As with the embodiment disclosed with regard to FIG. 1, the offsetting of the source contacts 241 and the drain contacts 242 in the ESD protection transistor device 200 results in increased resistance between the source and drain, underneath the transistor. With two contacts in each source area (or drain area), the density of current flow in the ESD protection transistor device 200 is further improved, resulting in a desirably small footprint with respect to the integrated circuit device on which it is disposed, without sacrificing any ESD protection effectiveness.

While at least one exemplary embodiment has been presented in the foregoing detailed description of the disclosure, it should be appreciated that a vast number of variations exist. It should also be appreciated that the exemplary embodiment or exemplary embodiments are only examples, and are not intended to limit the scope, applicability, or configuration of the disclosure in any way. Rather, the foregoing detailed description will provide those skilled in the art with a convenient road map for implementing an exemplary embodiment of the disclosure. It being understood that various changes may be made in the function and arrangement of elements described in an exemplary embodiment without departing from the scope of the disclosure as set forth in the appended claims.

What is claimed is:

1. An electro-static discharge (ESD) protection transistor device comprising:
    a semiconductor substrate;
    a guard ring fully-enclosing an ESD active area of the semiconductor substrate, wherein the guard ring comprises a ring-shaped area of implanted dopant ions and a plurality of guard ring contacts in electrical and physical contact with the ring-shaped area of implanted dopant ions, wherein the guard ring, including the ring-shaped area of implanted dopant ions and the plurality of guard ring contacts are disposed abutting, around, and adjacent to all sides of the ESD active area, and wherein the ESD active area comprises:
        a plurality of transistor gates that extend parallel to one another in a first direction;
        a plurality of source/drain diffusion areas that extend parallel to one another in a second direction perpendicular to the first direction, wherein each source/drain diffusion area comprises a plurality of source/drain areas disposed between respective ones of the plurality of transistor gates, thereby forming a plurality of source/drain pairs, each such pair comprising a source and a drain, on opposite sides of a respective transistor gate of the plurality transistor gates;
        a source contact positioned over each source area of the plurality of source areas; and
        a drain contact positioned over each drain area of the plurality of drain areas, wherein, with respect to each source/drain diffusion area of the plurality of source/drain diffusion areas, the source contacts are offset from the drain contacts with respect to the first direction, and wherein, for a respective source/drain pair, the source and the drain have width-ends that are co-linear with one another, in their entirety, in the second direction,
    wherein the ESD protection transistor device is positioned electrically in parallel with other electrical devices on the semiconductor substrate, and wherein the ESD protection transistor device is grounded such that the ESD protection transistor device grounds any current passing through the ESD active area.

2. The ESD protection transistor device of claim 1, wherein the plurality of source drain diffusion areas comprise a first type of dopant ion are disposed over an ESD active area comprising a second type of dopant ion, different from the first type of dopant ion.

3. The ESD protection transistor device of claim 1, wherein each source/drain diffusion area of the plurality of source/drain diffusion areas are elongated and discontinuously-doped in configuration and extend lengthwise in the second direction a greater distance than widthwise in the first direction.

4. The ESD protection transistor device of claim 3, wherein each source/drain diffusion area is spaced apart in the first direction by a spacing distance that is less than each source/drain diffusion area extends widthwise in the first direction.

5. The ESD protection transistor device of claim 1, wherein the plurality of transistor gates are configured in groupings of two parallel, adjacent transistor gates so as to separate each source/drain diffusion area of the plurality of source/drain diffusion areas into groupings of two source areas spaced apart by one drain area.

6. The ESD protection transistor device of claim 5, wherein, with respect to each source/drain diffusion area, the source contacts are co-linear with respect to one another in the second direction and the drain contacts are co-linear with respect to one another in the second direction.

7. The ESD protection transistor device of claim 2, further comprising a guard ring doped with the first type of dopant ion and surrounding the ESD active area.

8. The ESD protection transistor device of claim 7, further comprising a plurality of guard ring contacts in electrical and physical contact with the guard ring.

9. The ESD protection transistor device of claim 1, wherein the plurality of transistor gates are configured in groupings of two parallel, adjacent transistor gates so as to divide each source/drain diffusion area of the plurality of source/drain diffusion areas into groupings of two drain areas spaced apart by one source area.

10. The ESD protection transistor device of claim 9 comprising two drain contacts positioned over each drain area.

11. The ESD protection transistor device of claim 10, wherein for each source/drain diffusion area, the drain contacts are configured in two parallel, spaced apart rows with respect to the second direction and the source contacts form a single row in between the two parallel, spaced apart rows with respect to the second direction.

12. The ESD protection transistor device of claim 1 comprising two source contacts positioned over each source area.

13. The ESD protection transistor device of claim 12, wherein for each source/drain diffusion area, the source contacts are configured in two parallel, spaced apart rows with respect to the second direction and the drain contacts form a single row in between the two parallel, spaced apart rows with respect to the second direction.

14. An integrated circuit comprising:
a semiconductor substrate;
a plurality of active integrated circuit structures formed on the semiconductor substrate;
a chip pad or pin providing electrical connection to the plurality of active integrated circuit structures; and
on the semiconductor substrate and in proximity of the chip pad or pin, an electrostatic discharge (ESD) protection transistor device comprising:
a guard ring fully-enclosing an ESD active area of the semiconductor substrate, wherein the guard ring comprises a ring-shaped area of implanted dopant ions and a plurality of guard ring contacts in electrical and physical contact with the ring-shaped area of implanted dopant ions, wherein the guard ring, including the ring-shaped area of implanted dopant ions and the plurality of guard ring contacts are disposed abutting, around, and adjacent to all sides of the ESD active area;
within the ESD active area, a plurality of transistor gates that extend parallel to one another in a first direction;
within the ESD active area, a plurality of source/drain diffusion areas that extend parallel to one another in a second direction perpendicular to the first direction, wherein each source/drain diffusion area comprises a plurality of source/drain areas disposed between respective ones of the plurality of transistor gates, thereby forming a plurality of source/drain pairs, each such pair comprising a source and a drain, on opposite sides of a respective transistor gate of the plurality transistor gates;
a source contact positioned over each source area of the plurality of source areas; and
a drain contact positioned over each drain area of the plurality of drain areas, wherein, with respect to each source/drain diffusion area of the plurality of source/drain diffusion areas, the source contacts are offset from the drain contacts with respect to the first direction, and wherein, for a respective source/drain pair, the source and the drain have width-ends that are co-linear with one another, in their entirety, in the second direction,
wherein the ESD protection transistor device is positioned electrically in parallel with the plurality of active integrated circuit structures on the semiconductor substrate, and wherein the ESD protection transistor device is grounded such that the ESD protection transistor device grounds any current passing through the ESD active area.

15. The integrated circuit of claim 14, wherein the ESD protection transistor device is fully-silicided and wherein the ESD protection transistor device is free of ballast resistors.

16. The integrated circuit of claim 14, wherein the ESD protection transistor device is configured electrically in parallel with the plurality of active integrated circuit structures.

17. The integrated circuit of claim 16, wherein the ESD protection transistor device is configured with a trigger voltage threshold that is greater than a voltage threshold of the plurality of active integrated circuit structures.

18. An electro-static discharge (ESD) protection transistor device comprising:
a guard ring doped with an n-type dopant defining therewithin an ESD active area of a semiconductor substrate that is doped with a p-type ion dopant, wherein the guard ring has a plurality of guard ring contacts positioned thereover, wherein the guard ring, including the p-type ion dopant and the plurality of guard ring contacts are disposed abutting, around, and adjacent to all sides of the ESD active area;
a plurality of source/drain diffusion areas disposed within the ESD active area that are doped with an n-type dopant, that extend parallel to one another in a first direction, and that are spaced apart from one another in a second direction that is perpendicular to the first direction, wherein each source/drain diffusion area of the plurality of source/drain diffusion areas are elongated in configuration and extend discontinuously lengthwise in the first direction a greater distance than widthwise in the second direction, wherein each source/drain diffusion area is spaced apart in the second direction by a spacing distance that is less than each source/drain diffusion area extends widthwise in the second direction, and wherein each source/drain diffusion area is defined as having parallel width-ends such that each source area of a respective source/drain diffusion area extends, along its entire length, to the same position in the second direction as each drain area of the respective source/drain diffusion area, along its entire length;
a plurality of transistor gates that extend parallel to one another in the second direction, each of which separating each source/drain diffusion area of the plurality of source/drain diffusion areas so as to divide each source/drain diffusion area into a plurality of source areas and a plurality of drain areas, wherein the plurality of transistor gates are configured in groupings of two parallel, adjacent transistor gates so as to divide each source/drain diffusion area of the plurality of source/drain diffusion areas into groupings of two source areas spaced apart by one drain area or two drain areas spaced apart by one source area, and wherein, with respect to each source/drain diffusion area, the source contacts are co-linear with respect to one another in the second direction and the drain contacts are co-linear with respect to one another in the second direction;
a source contact positioned over each source area of the plurality of source areas; and
a drain contact positioned over each drain area of the plurality of drain areas, wherein, with respect to each source/drain diffusion area of the plurality of source/drain diffusion areas, the source contacts are offset from the drain contacts with respect to the second direction,
wherein the ESD protection transistor device is positioned electrically in parallel with other electrical devices on the semiconductor substrate, and wherein the ESD protection transistor device is grounded such that the ESD protection transistor device grounds any current passing through the ESD active area.

19. The ESD protection transistor device of claim 18, wherein the ESD protection transistor device is configured with a trigger voltage threshold that is greater than a voltage threshold of the plurality of active integrated circuit structures.

20. The ESD protection transistor device of claim 18, wherein the ESD protection transistor device is fully-silicided and wherein the ESD protection transistor device is free of ballast resistors.

* * * * *